United States Patent [19]
Kornfeld et al.

[11] Patent Number: 5,339,046
[45] Date of Patent: Aug. 16, 1994

[54] TEMPERATURE COMPENSATED VARIABLE GAIN AMPLIFIER

[75] Inventors: Richard K. Kornfeld, San Diego; Ana L. Weiland, Encinitas, both of Calif.; Mitsunari Okazaki, Fukushima, Japan

[73] Assignees: Alps Electric Co., Ltd., Tokyo, Japan; Qualcomm Inc., San Diego, Calif.

[21] Appl. No.: 72,303

[22] Filed: Jun. 3, 1993

[51] Int. Cl.[5] .................. H03G 3/30; H03F 1/30; H04B 17/00; H04B 1/04
[52] U.S. Cl. ..................... 330/277; 330/279; 330/289; 330/280; 330/281
[58] Field of Search ............. 330/279, 289, 280, 281, 330/277

[56] References Cited

U.S. PATENT DOCUMENTS

| | | | |
|---|---|---|---|
| 3,514,710 | 5/1970 | Janning, Jr. | 330/285 |
| 4,041,396 | 8/1977 | Fedde | 325/150 |
| 4,158,180 | 6/1979 | Challen | 330/298 |
| 4,320,350 | 3/1982 | Drapac | 330/202 |
| 4,447,783 | 5/1984 | Quick | 323/275 |
| 4,495,648 | 1/1985 | Giger | 455/73 |
| 4,510,460 | 4/1985 | Tamura | 330/285 |
| 4,523,155 | 6/1985 | Walczak et al. | 330/279 |
| 4,578,603 | 3/1986 | McPherson | 330/279 |
| 4,593,409 | 6/1986 | Miller | 455/73 |
| 4,602,218 | 7/1986 | Vilmur et al. | 330/279 |
| 4,613,990 | 9/1986 | Halpern | 455/33 |
| 4,654,882 | 3/1987 | Ikeda | 455/88 |
| 4,709,403 | 11/1987 | Kikuchi | 455/126 |
| 4,723,304 | 2/1988 | Maeda | 455/69 |
| 4,870,698 | 9/1989 | Katsuyama et al. | 455/67 |
| 5,029,298 | 7/1991 | Chiba et al. | 330/285 |
| 5,107,225 | 4/1992 | Wheatley et al. | 330/279 |
| 5,132,634 | 7/1992 | Suarez | 330/129 |
| 5,146,180 | 9/1992 | Hyakutake | 330/254 |

OTHER PUBLICATIONS

Textbook *Microelectronics Circuits*, 2nd Edition; A. S. Sedra, K. C. Smith; HRW, Inc., New York N.Y. 1987.

*Primary Examiner*—William L. Sikes
*Assistant Examiner*—Fetsum Abraham
*Attorney, Agent, or Firm*—Guy W. Shoup; Norman R. Klivans; Patrick T. Bever

[57] ABSTRACT

An amplifier for a radio transceiver overcomes the problem of gain being dependent on ambient temperature. Transmission power is matched to strength of a received signal by providing matched dual gate FET amplifier stages in both the transmitter and receiver portions of the transceiver. Changes in gain due to temperature are compensated for by detecting changes in the FET drain current by measuring the source voltage of the amplifier. The FET source voltage is compared to a reference voltage, and the output signal resulting from the comparison is provided as a control signal to one of the FET gates.

13 Claims, 6 Drawing Sheets

TEMPERATURE COMPENSATED VARIABLE GAIN AMPLIFIER

BACKGROUND OF THE INVENTION

1. Field of the Invention

The present invention relates to gain control circuits, and more particularly, a novel and improved temperature compensated gain control circuit including a field effect transistor.

2. Description of the Prior Art

FIG. 1 is a block diagram of a radio frequency transceiver used for mobile communications (such as in cellular telephony) as in U.S. Pat. No. 5,107,225. A receiver portion (receiver) 1 includes a low-noise amplifier 2, a first frequency converter (mixer) 3, a three-stage AGC (automatic gain control) amplifier having stages 4-a, 4-b, 4-c, a second frequency converter (mixer) 5, an intermediate frequency amplifier 6, and a base band signal processing circuit (not shown) for reception which is connected to the output terminal of the intermediate frequency amplifier 6. Amplifier 6 includes amplifier 6-a, first bandpass filter 6-b, second bandpass filter 6-c, and detector amplifier 6-d. The frequency sources 3', 11' provide the local oscillators for the mixing process. First frequency converter 3 mixes a received signal (e.g. approximately 881 MHz) and an output of first local oscillator 3' (e.g. approximately 951 MHz) and outputs a first intermediate frequency signal (e.g. approximately 70 MHz) by frequency conversion. Second frequency converter 5 mixes the first intermediate frequency signal and an output of local oscillator 5' (e.g. approximately 75 MHz) and outputs a second intermediate frequency signal (e.g. approximately 5 MHz) by frequency conversion. The intermediate frequency amplifier 6 includes a detection function and thus outputs a D.C. voltage (a detection signal) indicating the post AGC signal level. The detection signal is used for AGC.

Differential amplifier 7 compares the detection signal to signal $V_{REF}$. Signal $V_{REF}$ is a signal from the base band signal processing circuit, and is used for adjustment of the gain of the AGC amplifier stages 4-a, 4-b, 4-c. The output signal RX-$V_{AGC}$ of the differential amplifier 7 is input to each of the AGC amplifier stages 4-a, 4-b, 4-c to control the gain thereof. The AGC amplifier stages 4-a, 4-b, 4-c, the intermediate frequency amplifier 6, and the differential amplifier 7 form an AGC loop. The AGC amplifier stages 4-a, 4-b, 4-c, the intermediate frequency amplifier 6, the base band signal processing circuit, and the differential amplifier 7 form another control loop.

A transmitter portion (transmitter) 8 includes a base band signal processing circuit (not shown) for transmission, a first frequency converter 9 for converting the carrier frequency modulated by the base band signal (e.g., carrier frequency is approximately 5 MHZ) to the first intermediate frequency signal (e.g. approximately 70 MHz), a three-stage AGC amplifier 10-a, 10-b, 10-c, a second frequency converter 11, and a power amplifier 12. The first frequency converter 9 receives the output of the first local oscillator 9' (e.g. approximately 75 MHz) and outputs the first intermediate frequency signal. The second frequency converter 11 mixes the first intermediate frequency signal and the output of the second local oscillator 11' (e.g. approximately 906 MHz) and outputs the radio frequency signal (e.g. approximately 836 MHz). Adding circuit 13 adds AGC signal RX-$V_{AGC}$ of the receiver portion 1 to a transmission level setting signal TX-$V_{GAIN\ CONT}$ and outputs an AGC voltage TX-$V_{AGC}$ for control of the gain of the AGC transmitter amplifier stages 10-a, 10-b, 10-c. A signal transmitted from the base station to the mobile station includes power control information for controlling the transmission power from the mobile station to the base station. Receiver portion 1 of the mobile station receives the signal transmitted from the base station, and an internal circuit (not shown) of the mobile station varies the level of signal TX-$V_{GAIN\ CONT}$ based on the power control information. Signal TX-$V_{GAIN\ CONT}$ controls the transmission power by means of transmitter portion 8.

Duplexer 14 connects the transmit signal path and the receive signal path to the antenna. Antenna 15 is thereby conventionally used for both transmission and reception.

In the system of FIG. 1 transmission power is controlled in response to the level of the received signal. That is, when the level of the received signal is low, transmission power is increased, and when the received signal level is high, transmission power is reduced.

FIG. 2 shows detail of one stage of the AGC amplifier stages 4-a, 4-b, 4-c of the receiver portion 1 and one stage of the AGC amplifier stages 10-a, 10-b, 10-c of the transmitter portion 8. Each of the AGC amplifiers includes a dual gate MOSFET (metal oxide semiconductor field effect transistor) respectively Q4, Q1. An AGC voltage is applied to a second gate G2 of MOSFETs Q1, Q4. Power is supplied at the terminals labelled "+B".

In the above-described circuit, when the level of a received signal is high, the level of the detection signal increases, lowering AGC voltage RX-$V_{AGC}$ of the receiver portion 1 which is the output of the differential amplifier 7. Consequently, the voltage at the second gate G2 of each of the MOSFETs of the AGC amplifier stages 4-a, 4-b, 4-C is lowered, thus reducing the gain of the AGC amplifier stages 4-a, 4-b, 4-c. AGC voltage RX-$V_{AGC}$ of the receiver portion 1 is also applied to the second gate G2 of each of the MOSFETs of the AGC amplifier stages 10-a, 10-b, 10-c of the transmitter portion 8 via the adding circuit 13, thus reducing the gain of the AGC amplifier stages 10-a, 10-b, 10-c.

In a dual gate MOSFET amplifier where gain is controlled by gate voltage, the gain (vertical axis) changes with respect to gate voltage (horizontal axis) with various ambient temperatures as shown by FIG. 3a. At a high gate voltage, the gain at high ambient temperature (curve B) is lower than that at low ambient temperature (curve A). At a low gate voltage, the gain at high ambient temperature is higher than the gain at low ambient temperature.

Therefore when ambient temperature changes, amplifier gain may change even if the level of the received signal remains the same, thus changing the AGC voltage. The AGC voltage of the receiver portion 1 is applied to both the AGC amplifier of the receiver portion and the AGC amplifier stages 10-a, 10-b, 10-c of the transmitter portion 8. Even if the level of the received signal does not change, changes in the ambient temperature change the transmitter power of the transmission portion 8. Consequently, the desired relationship between received signal level and transmitter power may not occur, and hence the system may not operate as desired.

SUMMARY OF THE INVENTION

A dual gate FET in an amplifier stage is an AGC device and in accordance with the invention its gain is determined by setting its drain current, instead of by setting its gate voltage as in the prior art. The drain current (converted to a voltage) is then monitored over temperature fluctuations and compared to a reference voltage. The difference of the two voltages is integrated to produce a gate voltage for the FET corresponding to the desired current under the ambient temperature operating condition.

In one embodiment, the FET's drain current is measured by monitoring the FET's source voltage; the current measurement may also be implemented in other ways.

DETAILED DESCRIPTION OF THE INVENTION

Figure 3A:
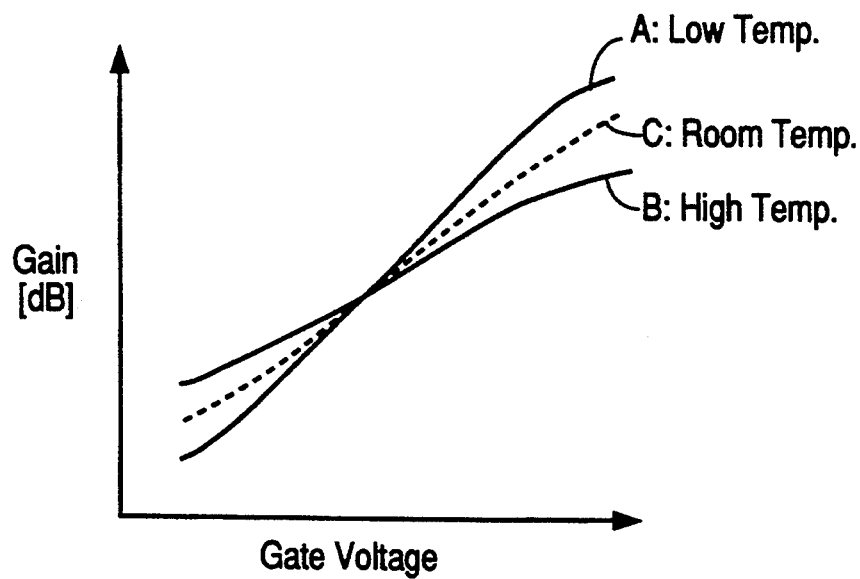
FIG. 3a shows gain fluctuating with ambient temperature for the prior art transceiver.
Figure 3B:
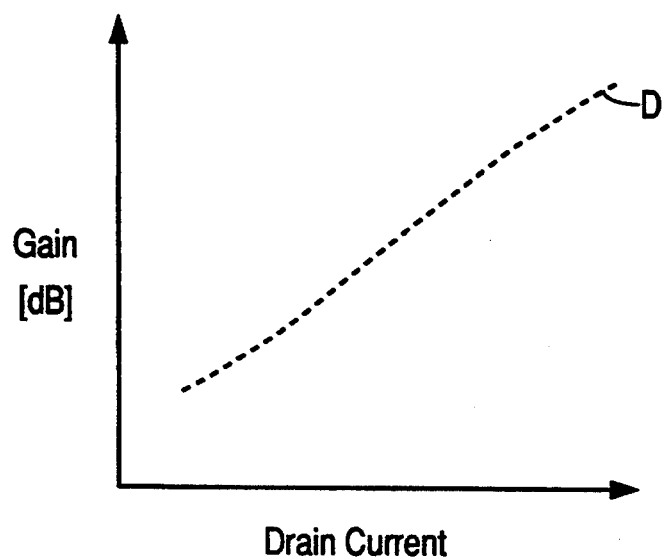
FIG. 3b shows gain relatively constant with respect to ambient temperature in accordance with the present invention.

The present inventors discovered that as gain of an FET amplifier changes, the amplifier current changes, and there is a close correlation between the amplifier gain and amplifier current. Hence it was discovered that FET current is a more constant indication of gain over varying temperature and other conditions than is FET gate voltage. FIG. 3b shows gain (vertical axis) vs. drain current (horizontal axis) in accordance with the invention, for an FET amplifier where gain is controlled by drain current. A single curve D shows both high, low, and intermediate (room) ambient temperature data. Contrast this to the three curves A, B, and C of FIG. 3a for the prior art. Therefore, the present inventors determined that changes in the gain caused by ambient temperature changes can be readily compensated for by detecting changes in the current drawn by the amplifier FET. One way to measure this current is by measuring the source voltage of the amplifier FET.

Figure 4:
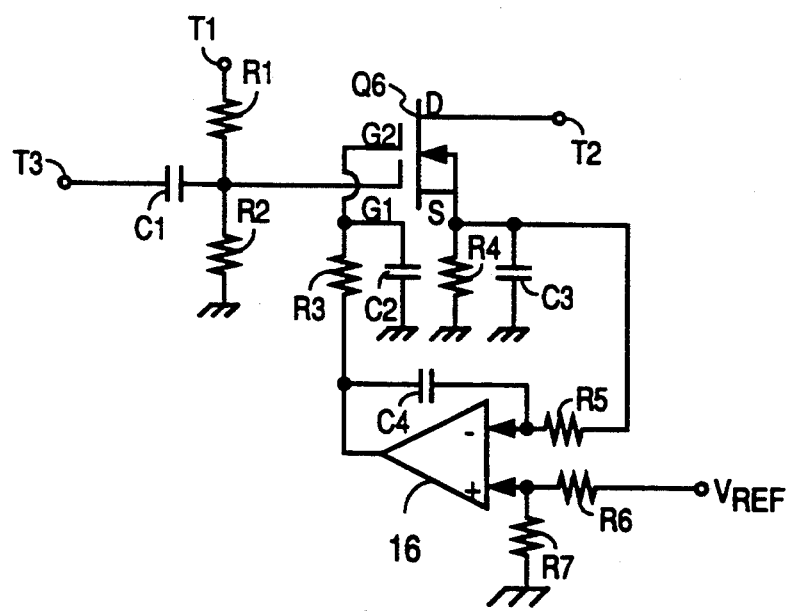
FIG. 4 shows an amplifier in accordance with the invention.

FIG. 4 shows a circuit in accordance with the present invention. The voltage of source S of amplifier dual gate FET Q6 is coupled via differential amplifier 16 to gate G2 of dual gate FET Q6. Resistors R1, R2, R3, R4, R5, R6, and R7 and capacitors C1, C2, C3, C4 are conventional. Power is applied to terminals T1, T2, and the signal to be amplified to terminal T3; the amplified output signal is at drain D. When the gain is reduced due to an increase in ambient temperature, drain D current of FET Q6 decreases, thus lowering the voltage of source S of FET Q6. The reduced source voltage is applied to the inverting terminal of amplifier 16, where it is integrated with respect to reference signal $V_{REF}$, and the resultant output signal from amplifier 16 is applied to the second gate G2 of FET Q6. Consequently, the current at drain D of FET Q6 increases, hence increasing the gain of FET Q6, compensating for temperature changes.

Figure 5:
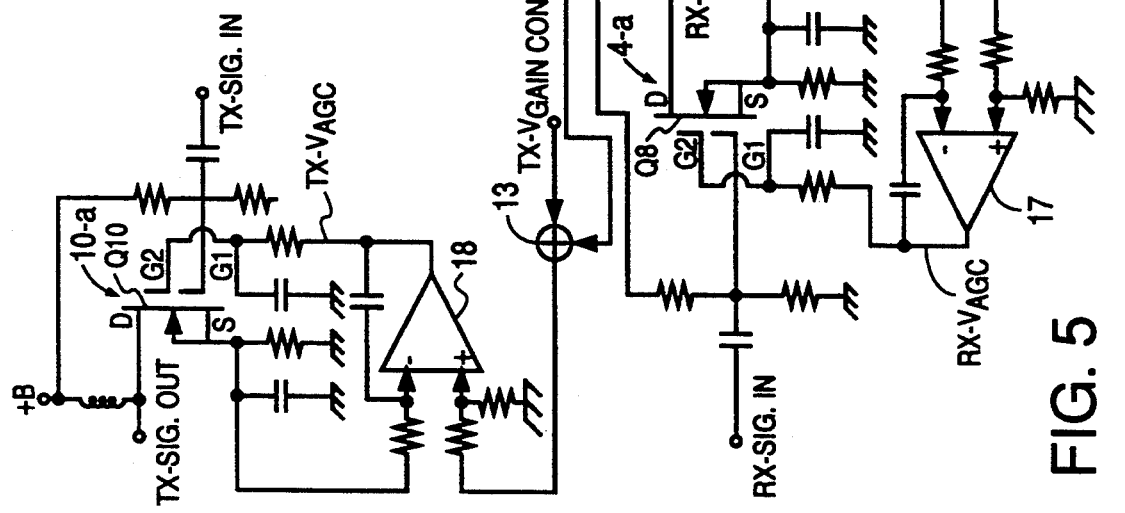
FIG. 5 shows a portion of a transceiver in one embodiment of the invention.

An embodiment of the present invention is shown in FIG. 5 including the circuit of FIG. 4. The detection signal of the receiver portion (lower part of FIG. 5) is compared by differential amplifier (comparator) 7 to reference signal $V_{REF}$, and the resulting output of differential amplifier 7 is then applied to the non-inverting input terminal of a second differential amplifier 17. A voltage of source S of the FET Q8 of the AGC amplifier 4-a is applied to the inverting input terminal of differential amplifier 17 and to the adding circuit 13. The output signal AGC voltage RX-$V_{AGC}$ of differential amplifier 17 is applied to the second gate G2 of the FET Q8 of the AGC amplifier 4-a.

The sum from adder 13 of (1) the transmission level setting signal voltage TX-$V_{GAIN\ CONT}$ and (2) source voltage of source S of FET 8 is applied to the non-inverting input terminal of differential amplifier 18 in the transmitter portion. A voltage of source S of FET Q10 of the AGC amplifier 10-a of the transmitter portion is applied to the inverting input terminal of differential amplifier 18. The output signal of differential amplifier 18 is AGC voltage TX-$V_{AGC}$.

In the receiver portion, the second gate G2 of FET Q8, the source S of FET Q8, and the differential amplifier 17 form a closed loop, so that the temperature changes are compensated for by AGC amplifier 4-a. Similarly, source S, gate G2 of FET Q10 of AGC amplifier 10-a of the transmitter portion, and differential amplifier 18 form a closed loop, and temperature changes can thus be compensated for by AGC amplifier 10-a. The compensation signal RX-$V_{AGC}$ of the AGC amplifier 4-a of the receiver portion is applied to the AGC amplifier 10-a of the transmitter portion via the adding circuit 13.

Figure 1:
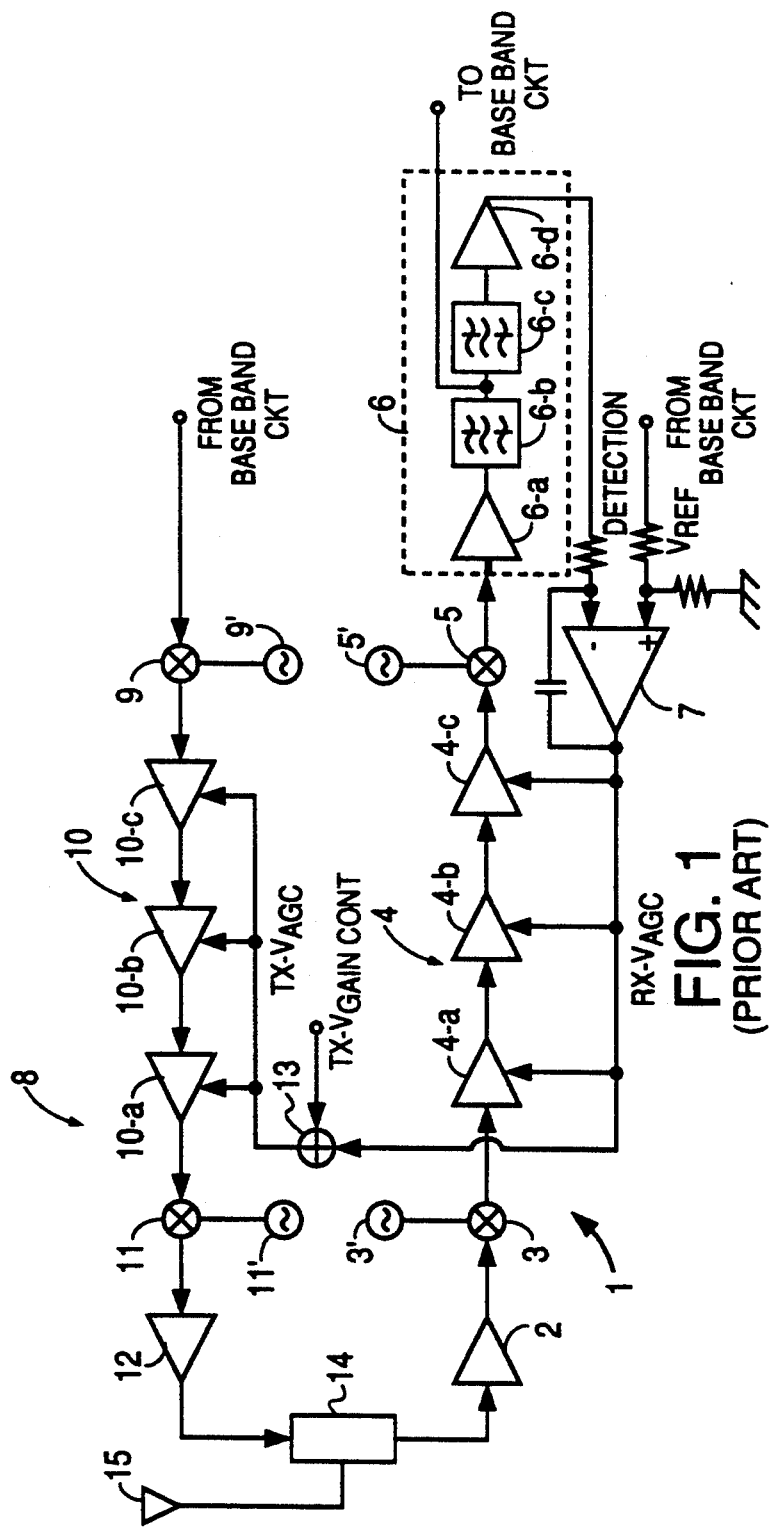
FIG. 1 shows a prior art transceiver.
Figure 2:
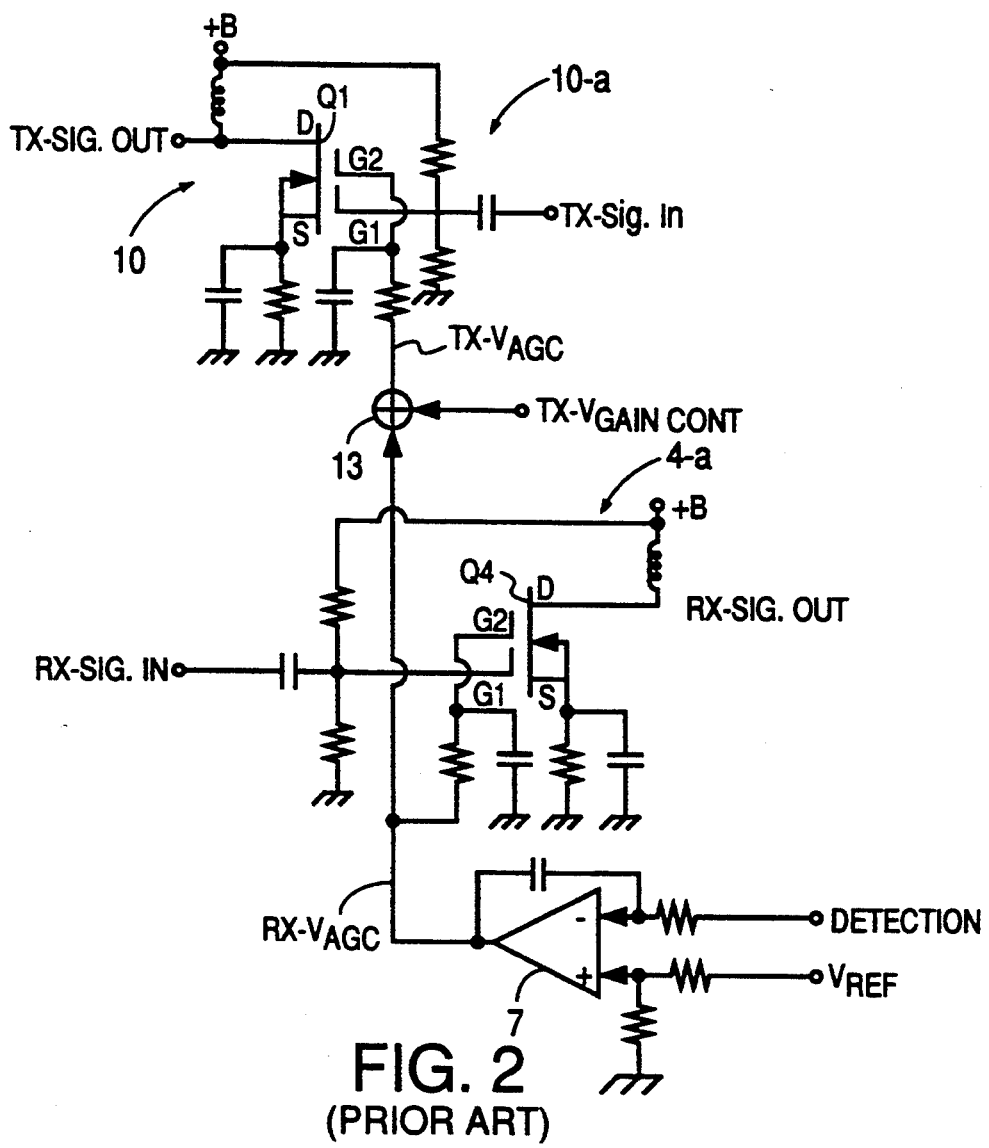
FIG. 2 shows detail of FIG. 1.
Figure 6:
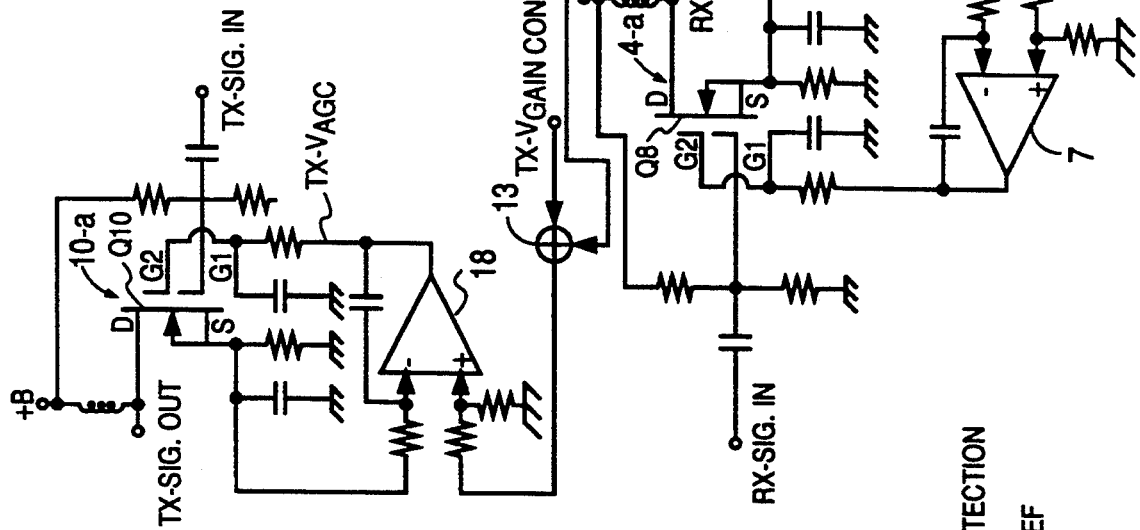
FIG. 6 shows a portion of a transceiver in a second embodiment of the invention.

A second embodiment is shown in FIG. 6. Most of this circuit is identical to that of FIG. 5, except that in this embodiment the differential amplifier 17 of the embodiment of FIG. 5 is eliminated and hence AGC amplifier 4-a does not have a temperature compensated loop in accordance with the present invention, so temperature compensation occurs through the outer control loop as described above with reference to FIGS. 1 and 2. Hence in this embodiment there is no feedback loop within amplifier 4-a.

Figure 7:
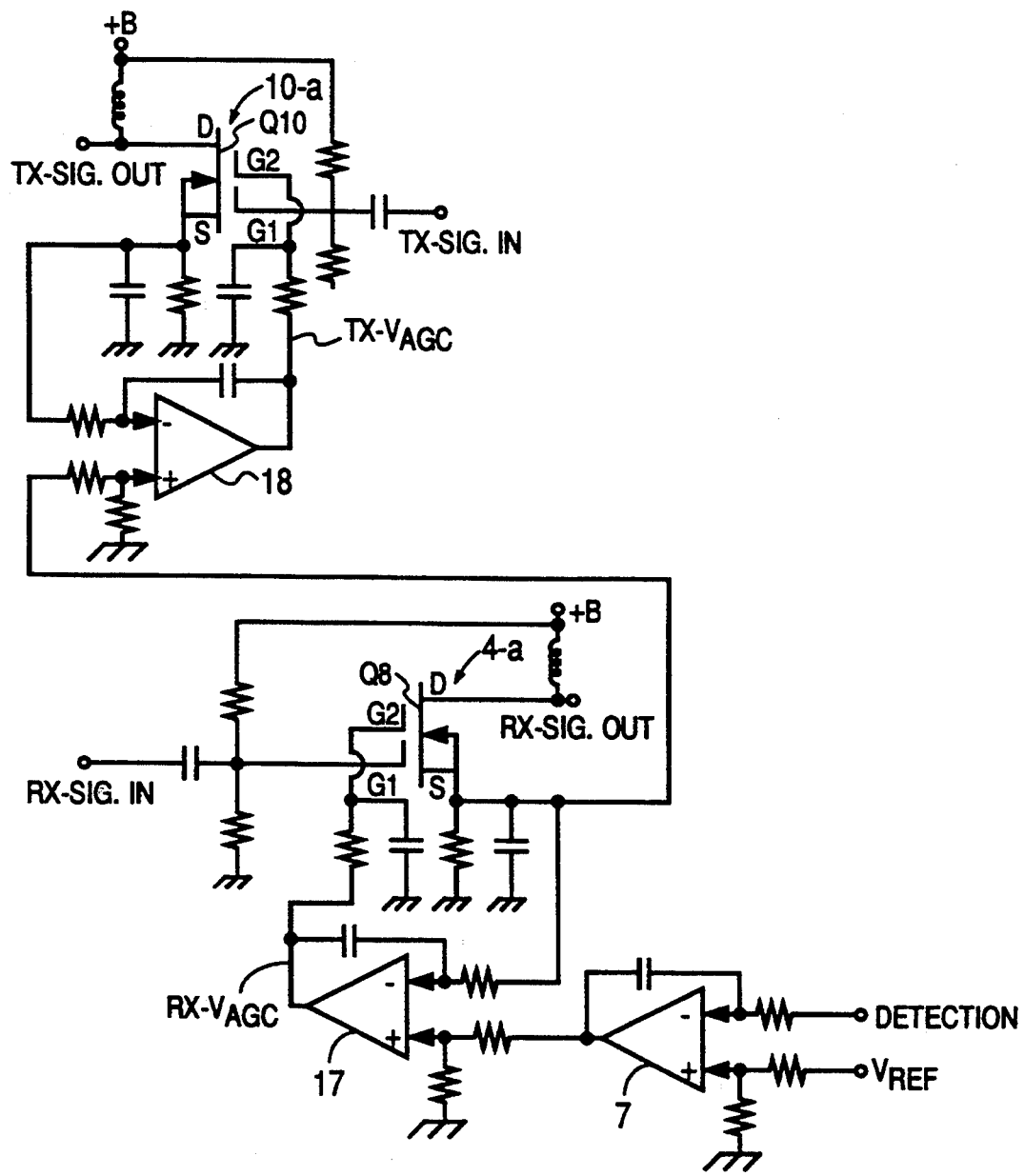
FIG. 7 shows a portion of a transceiver in a third embodiment of the invention.

FIG. 7 shows a third embodiment, similar to that of FIG. 5, but simpler in that the source voltage of amplifier 4-a (or the amplifier 7 output) drives the input to amplifier 18, with no adder. This embodiment allows transmission gain adjustments to be carried out by a variety of methods, such as a baseband level variation independent of the IF (intermediate frequency) level variation.

In accordance with the invention, since changes in amplifier gain due to changes in ambient temperature are greatly reduced, the transmitter power is controlled accurately, for example in response to the level of a received signal. Thus, in a transceiver in accordance with the invention, deterioration in communications quality due to variation in transmission power is greatly reduced.

It is to be understood that the invention is also applicable to FET amplifiers where the FET has a single gate, and to amplifiers of types other than those disclosed herein. This description is illustrative and not limiting; further modifications will be apparent to one of ordinary skill in the art, in light of this disclosure and the appended claims.

What is claimed is:

1. An amplifier comprising:
   a field effect transistor having two gate terminals, a drain terminal, and a source terminal;
   a comparator having two input terminals and an output terminal;
   wherein a first input terminal of said comparator is connected to a reference voltage, said second input terminal of said comparator is connected to said source terminal and said output terminal of said comparator is connected to one of said two gate terminals; and
   a source of said reference voltage which includes a second comparator having two input terminals and an output terminal, said two input terminals of said second comparator being connected to respectively a reference signal and a signal strength indicating signal, and said output terminal of said second comparator being connected to said first input terminal of said first comparator.

2. An amplifier comprising:
   a field effect transistor having two gate terminals, a drain terminal, and a source terminal;
   a comparator having two input terminals and an output terminal;
   wherein a first input terminal of said comparator is connected to a reference voltage, said second input terminal of said comparator is connected to said source terminal and said output terminal of said comparator is connected to one of said two gate terminals;
   a second field effect transistor having two gate terminals, a drain terminal, and a source terminal;
   a second comparator associated with said second field effect transistor and having two input terminals and an output terminal; and
   means for connecting said source terminal of said field effect transistor to a first input terminal of said second comparator, said source terminal of said second field effect transistor being connected to said second input terminal of said second comparator, and said output terminal of said second comparator being connected to one of said gate terminals of said second field effect transistor.

3. The amplifier of claim 2, wherein said means for connecting includes an adding circuit.

4. An amplifier comprising:
   a field effect transistor having two gate terminals, a drain terminal, and a source terminal;
   a comparator having two input terminals and an output terminal;
   wherein a first input terminal of said comparator is connected to a reference voltage, said second input terminal of said comparator is connected to said source terminal and said output terminal of said comparator is connected to one of said two gate terminals; and
   a source of said reference voltage which includes:
     a second field effect transistor having two gate terminals, a source terminal, and a drain terminal; and
     a circuit connecting said source terminal of said second field effect transistor to said first input terminal of said comparator.

5. A compensated variable gain amplifier comprising:
   a biased field effect transistor having two gate terminals and a source terminal and for amplifying a signal coupled to a first gate terminal thereof in response to a control signal coupled to a second gate terminal thereof, said biased field effect transistor having a source voltage at said source terminal;
   means for integrating a difference between a reference signal and said source voltage and for producing said control signal therefrom;
   a second biased field effect transistor having two gate terminals and a source terminal and for amplifying a second signal coupled to a first gate terminal of said second transistor in response to a second control signal coupled to a second gate terminal of said second transistor, said second transistor having a source voltage at said source terminal;
   means for adding said source voltage of said first transistor to a adjustment voltage to produce a second reference signal; and
   means for integrating a difference between said second reference signal and said source voltage of said second transistor and for producing said second control signal therefrom.

6. The compensated variable gain amplifier of claim 5, wherein said first means for integrating comprises an operational amplifier.

7. A compensated variable gain amplifier comprising:
   a biased field effect transistor having two gate terminals and a source terminal and for amplifying a signal coupled to a first gate terminal thereof in response to a control signal coupled to a second gate terminal thereof, said biased field effect transistor having a source voltage at said source terminal;
   means for integrating a difference between a reference signal and said source voltage and for producing said control signal therefrom;
   a second biased field effect transistor having two gate terminals and a source terminal and for amplifying a second signal coupled to a first gate terminal of said second transistor in response to a second control signal coupled to a second gate terminal of said second transistor, said second transistor having a source voltage at said source terminal; and
   means for integrating a difference between said reference signal and said source voltage of said second transistor and producing said second control signal therefrom.

8. A compensated variable gain amplifier comprising:
   a biased field effect transistor having two gate terminals and a source terminal and for amplifying a signal coupled to a first gate terminal thereof in response to a control signal coupled to a second gate terminal thereof, said biased field effect transistor having a source voltage at said source terminal;
   means for integrating a difference between a reference signal and said source voltage and for producing said control signal therefrom;
   a second biased field effect transistor having two gate terminals and a source terminal and for amplifying a second signal coupled to a first gate terminal of said second transistor in response to a second control signal coupled to a second gate terminal of said second transistor, said second transistor having a source voltage at said source terminal; and means for integrating a difference between said source voltage of said first transistor and said source voltage of said second transistor and for producing said second control signal therefrom.

9. A compensated variable gain amplifier comprising:
a first biased field effect transistor for amplifying a signal coupled to a first gate terminal thereof in response to a control signal coupled to a second gate terminal thereof, said biased field effect transistor having a source voltage;
a second biased field effect transistor for amplifying a second signal coupled to a first gate terminal of said second transistor in response to a second control signal coupled to a second gate terminal of said second transistor, said second transistor having a source voltage;
means for adding said source voltage of said first biased field effect transistor to an adjustment voltage and producing a reference signal; and
means for integrating a difference between said reference signal and said source voltage of said second transistor and for producing said second control voltage therefrom.

10. A method of compensation for a dual gate field effect transistor comprising:
measuring a voltage level of the source of said dual gate field effect transistor;
comparing the measured voltage level to a reference voltage indicating a desired gain of said dual gate field effect transistor and producing a resultant signal;
applying said resultant signal to a first gate of said dual gate field effect transistor;
applying an analog signal to a second gate of said dual gate field effect transistor;
amplifying by said dual gate field effect transistor said analog signal by an amount set by said resultant signal;
providing the amplified analog signal at the drain terminal of said dual gate field effect transistor;
adding said measured voltage level of the source to an additional signal to produce a sum signal;
measuring a voltage level of the source of a second dual gate field effect transistor;
comparing the measured voltage level of the source of said second dual gate field effect transistor to said sum signal and producing a second resultant signal; and
applying said second resultant signal to the second gate of said second dual gate field effect transistor.

11. A method of controlling the gain of a dual gate field effect transistor (FET) comprising the steps of:
measuring a current level drawn by the drain of said dual gate FET;
comparing the measured current level to a reference signal indicative of a predetermined gain of said dual gate FET and producing a resultant signal;
applying said resultant signal to the first gate of said dual gate FET; and
providing said reference signal by:
providing a reference voltage;
providing a signal strength indicating signal;
comparing said reference voltage to said signal strength indicating signal; and
providing a result of the step of comparing as said reference signal.

12. The method of claim 11 further comprising the steps of:
applying a signal for amplification of the second gate of said dual gate FET;
amplifying said signal by an amount set by said resultant signal; and
providing an amplified signal at the drain of said dual gate FET.

13. The method of claim 11 wherein the current measured is proportional to the gain of said dual gate FET.

* * * * *